United States Patent [19]

Gluck et al.

[11] Patent Number: 5,227,313

[45] Date of Patent: Jul. 13, 1993

[54] PROCESS FOR MAKING BACKSIDE ILLUMINATED IMAGE SENSORS

[75] Inventors: Ronald M. Gluck, Rochester; Edmund K. Banghart, Pittsford; Madhav Mehra, Rochester, all of N.Y.

[73] Assignee: Eastman Kodak Company, Rochester, N.Y.

[21] Appl. No.: 918,536

[22] Filed: Jul. 24, 1992

[51] Int. Cl.$^5$ .......................................... H01L 31/18
[52] U.S. Cl. ...................... 437/2; 437/225; 437/236; 437/974; 148/DIG. 12; 148/DIG. 135
[58] Field of Search ............... 437/2, 3, 4, 5, 974, 437/225, 236, 53, 238, 86; 148/DIG. 12, DIG. 135

[56] References Cited

U.S. PATENT DOCUMENTS

| | | | |
|---|---|---|---|
| 3,508,980 | 4/1970 | Jackson, Jr. et al. | 148/DIG. 12 |
| 4,266,334 | 5/1981 | Edwards et al. | 29/583 |
| 4,840,918 | 6/1989 | Sheu et al. | 437/2 |
| 4,946,716 | 8/1990 | Corrie | 437/974 |
| 4,980,308 | 12/1990 | Hayashi et al. | 437/974 |
| 4,983,251 | 1/1991 | Haisma et al. | 148/DIG. 12 |
| 5,013,681 | 5/1991 | Godbey et al. | 437/86 |
| 5,054,683 | 10/1991 | Haisma et al. | 437/974 |
| 5,102,821 | 4/1992 | Moslehi | 437/974 |
| 5,110,748 | 5/1992 | Sarma | 148/DIG. 12 |

FOREIGN PATENT DOCUMENTS 2206445 1/1989 United Kingdom ....... 148/DIG. 12

OTHER PUBLICATIONS

Janesick et al., "Charge Coupled Device Pinning Technologies", SPIE Optical Sensors and Electronic Photography, vol. 1071-15, Jan. 1989.
Huang et al., A Wafer-Scale Thinning Process for High Performance Silicon Devices, Abstract, 481, 174th Electrochem. Soc. Mtg., 88(2), 705, 1988.
Maszara et al., Bonding of Silicon Wafers for Silicon-on-Insulator, J. Appl. Phys., 64(10), 4943, Nov. 1988.
Blouke et al., Large Format, High Resolution Image Sensors, Optical Engineering, vol. 26, No. 9, 837, 1987.
M. Kimura et al., Epitaxial Film Transfer Technique for Producing Single Crystal Si Film on an Insulating Substrate, Appl. Phys. Lett., vol. 43, No. 3, Aug. 1983, 263-265.
R. A. Stern et al., Optical Engineering, vol. 26, No. 9, 875, (1987), "Ultraviolet and Extreme Ultraviolet response of CCD Detectors".
C. M. Huang et al., Proceedings 1991 IEEE CCD Workshop, University of Waterloo, (1991), "Quantum Efficiency Model for P+doped Back Illuminated CCD Imager".
G. Goetz et al., Abstract No. 309, 177th Electrochemical Society Meeting, 90-1, 462, (1990), "Heterostructures by Generalized Bonding Techniques".
H. Seidel et al., J. Electrochemical Society, vol. 137, No. 11, 3626, (1990), "Anisotropic Etching of Crystalline Si in Alkaline Solutions".
H. Muraoka et al., "Controlled Preferential Etching Technology", in Semiconductor Silicon, 1973, pp. 327-338.
M. M. Blouke, Proc. SPIE, 1439, (1990), "Model of a Thinned CCD".

(List continued on next page.)

*Primary Examiner*—Brian E. Hearn
*Assistant Examiner*—Michael Trinh
*Attorney, Agent, or Firm*—Raymond L. Owens

[57] ABSTRACT

A process for making a backside illuminated image sensor fabricated upon a thinned silicon layer bonded to a quartz wafer is described. A borosilicate glass (BSG) layer interposed between the thinned silicon device layer and quartz support serves as a doping source for the back-surface accumulating electrostatic potential and serves to minimize stress associated with the thermal expansion differences associated with quartz and silicon.

7 Claims, 15 Drawing Sheets

OTHER PUBLICATIONS

R. Stern et al., Instrumentation in Astronomy VI, D. C. Crawford Ed., Proc. SPIE 627, 583, (1986), "EUV Astronomical Spectroscopy with CCD Detectors".

Kern et al., J. Electrochemical Soc., vol. 117, No. 4, 562 and 568, (1970), "CVD of Silicate Glass for Use with Silicon Devices".

J. L. Gray, Phd. Thesis, Purdue University, West Lafayette, Ind., Aug. 1982, "Two Dimensional Modeling of Silicon Solar Cells", 1–125.

C. P. Ho et al., Technical Report No. SEL 84–001, Sanford Univ. Electronics Lab., Stanford Univ., Stanford, Calif., Jul. 1984, "Suprem III—A Program for IC Process Modeling and Simulation".

Deal et al., J. Electrochemical Society, vol. 114, 267, (1967), "Characteristics of the Surface State Charge of Thermally Oxidized Silicon".

R. R. King et al., IEEE Trans. on Electron Devices, vol. 38, 1399, (1991), No. 6, "Studies of Diffused Boron Emitters: Saturation Current, . . . ".

A. S. Grove, Physics and Technology of Semiconductor Devices, John Wiley, New York, 1967, pp. 144–145.

Handbook of Optics, Optical Society of America, McGraw–Hill, 6-94, (1978), FIG. 6C-83, W. G. Driscou.

PROCESS FOR MAKING BACKSIDE ILLUMINATED IMAGE SENSORS

FIELD OF THE INVENTION

The present invention relates to fabrication of backside illuminated image sensors.

BACKGROUND OF THE INVENTION

There is a need for image sensors to be sensitive to ultraviolet and far ultraviolet radiation. Image sensors of the frame transfer type cannot be used with frontside illumination due to the absorption of the short wavelength radiation by polysilicon gate electrodes. Interline type imagers, while sensitive to the radiation, provide only 30-35% of their surface area for sensing, and are thereby limited.

Presently, a number of investigators are pursuing the development of backside illuminated image sensors by removing silicon from the backside of the devices. The thinned backside is treated to provide an electrical potential which forces electrons generated at or near the backside towards potential wells under the image gates. See J. Janesick et al. "CCD Pinning Technologies", SPIE Optical Sensors and Electronic Photography, Vol. 1071-15, Los Angeles, Jan. 16-18, (1989); C. M. Huang et al. Abstract No. 481, 174th Electrochemical Society Mtg., 88-2, 705 (1988); T. W. Edwards and R. S. Pennypacker, U.S. Pat. No. 4,266,334, May 21, 1981; and M. Blouke et al., Optical Engineering, Vol. 26, No. 9, 837, (1987). These methods involve operations which can degrade the silicon quality, such as mechanical lapping, ion implantation, and laser annealings. The loss of silicon quality results in high surface recombination velocity values. To shield the back surface from recombination losses, very high doping gradients are required to form an adequate backside electrical potential. See R. A. Stern et al., Optical Engineering, Vol. 26, No. 9, 875 (1987) and C. Huang, Proceedings 1991 IEEE CCD Workshop, University of Waterloo (1991).

A technique for bonding quartz wafers to silicon wafers has been reported. See G. Goetz and A. Fathimulla, Abstract No. 309, 177th Electrochemical Society Meeting, 90-1, 462 (1990). This method requires that the silicon bonded to the quartz be etched into islands prior to high temperature processes in order to avoid damage associated with thermal expansion induced stress.

Methods for providing silicon etch stops have been disclosed. For example, see W. P. Maszara et al., J. Applied Physics, 64(10) 4943 (1988); H. Seidel et al, J. Electrochemical Society, Vol. 137, No. 11, 3626 (1990); and H. Muraoka et al. "Controlled Preferential Etching Technology", in Semiconductor Silicon 1973, edited by H. R. Huff and R. R. Burgess, Electrochemical Society, Princeton, N.J. 327, (1973).

The diffusion of boron into silicon from doped oxide surfaces has been modeled by Barry. See Barry and Olofsen, J. Electrochemical Soc., Vol. 116, No. 6, 854, (1969) and Barry and Manoliu, J. Electrochemical Society, Vol. 117, No. 2, 258, (1970).

Calculations of image sensor quantum efficiency have been made by several groups. For example see: C. M. Huang et al., "Future Development for Thinned Back-Illuminated CCD Imager Devices", 1991 IEEE CCD Workshop, University of Waterloo, Canada (1991); J. Janesick and D. Campeu, IEEE Int. Electron Devices Meeting, 350 (1986); M. M. Blouke, Proc. SPIE, 1439 (1990); and R. Stern et al. in Instrumentation in Astronomy VI, D. C. Crawford, Ed., Proc. SPIE 627, 583 (1986).

The deposition and properties of borosilicate glasses have also been studied. See W. Kern and R. C. Heim, J. Electrochemical Soc., Vol. 117, No. 4, 562 and 568, (1970). The use of a borosilicate glass layer to support a silicon wafer undergoing a thinning process is reported in U.S. Pat. No. 4,946,716, Aug. 7, 1990 to Brian L. Corrie.

Existing fabrication methods thin the device wafer after the devices have received most of the steps involved in their manufacture. Yield losses incurred due to thinning and backside accumulation operations are expensive since a great deal of processing has been invested in the devices prior to thinning. In addition, some methods require contacting of the device bond pads from the wafer backside. This involves aligning backside masks to the frontside device structures and etching contact holes to the bond pads. This is a complex and expensive process.

SUMMARY OF THE INVENTION

This invention involves a process by which a backside illuminated image sensor is fabricated upon a thinned silicon layer bonded to a quartz wafer. A borosilicate glass (BSG) layer interposed between the thinned silicon device layer and quartz support serves to minimize stress associated with the thermal expansion differences associated with quartz and silicon. The BSG layer also acts as a source of boron atoms which diffuses into the silicon device during thermal processes involved in sensor fabrication. The sensor backside boron doping creates the required potential in the thinned silicon which forces electrons photogenerated at or near the back surface towards potential wells under the imager gates located at the frontside of the device.

In accordance with the doping process of this invention, silicon damage is minimized. Reduced silicon damage permits the use of the simplified doping method involving BSG source diffusion. A thermal oxide interposed between the BSG layer and the silicon device is found necessary to obtain optimized sensor quantum efficiency (QE). Additionally, the thinning and bonding operations are performed prior to device fabrication, which has the advantage of less costly yield loss at the thinning stage. Less processing effort has been invested in the wafers when they are thinned than alternative technologies which thin the silicon after most of device fabrication is completed.

MODE OF CARRYING OUT THE INVENTION

Figure 1:
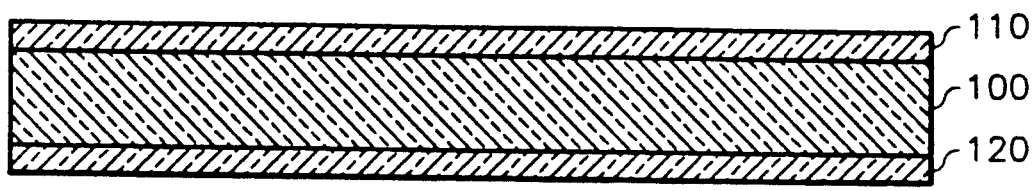
FIG. 1 shows a polished clear fused quartz support wafer which has been coated with a silicon nitride layer on one surface and a borosilicate glass layer on the other surface.

Referring to FIG. 1, a polished clear fused quartz wafer 100 is coated with a silicon nitride layer 110 on one side and a borosilicate glass (BSG) layer 120 on the other side. The coatings can be applied using conventional low pressure chemical vapor deposition (LPCVD) methods. The silicon nitride coating thickness is not critical, with a typical range of 500-1200 Å. The BSG layer thickness is 500-5000 Å. The BSG layer may have a uniform $B_2O_3$ concentration between 2 mole percent and 17 mole percent or a linear concentration increasing from 0% at the quartz interface to a predetermined maximum value ranging from 2 mole percent to 17 mole percent at the other side of the coating.

The purpose of silicon nitride is to provide the quartz wafer protection from a subsequent thinning etch and to provide a diffusion barrier for impurities during the subsequent device fabrication process. The purpose of the BSG layer is to provide a source of boron atoms for diffusion into the silicon device to be fabricated. Additionally, the BSG provides a stress minimization layer between the quartz substrate and the silicon device layer.

Figure 2:
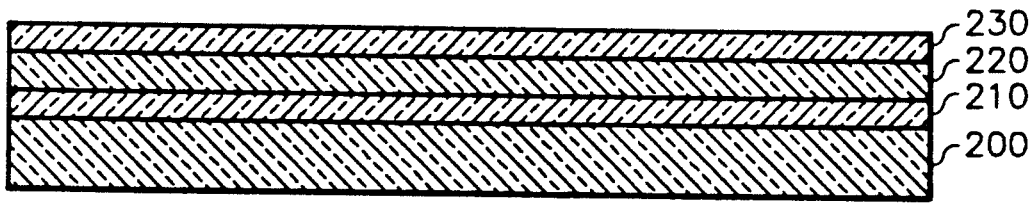
FIG. 2 shows a p-type silicon wafer which has been epitaxially overcoated with a p+ etch stop layer, and a p-type device layer. The device layer surface is thermally oxidized to form a thin oxide layer.

Referring to FIG. 2, a p-type silicon wafer 200 with boron content less than $10^{18}/cm^3$ is epitaxially coated with an etch stop layer 210. The etch stop can be, but is not limited to boron ($1\times10^{20}/cm^3$) and germanium ($1\times10^{21}/cm^3$) co-doped in silicon. Use of this etch stop allows a high etch selectivity and a high quality silicon device layer to be epitaxially grown over it. The etch stop is epitaxially overcoated with a silicon device layer 220 which is designed specifically for the image sensor to be fabricated. A preferred doping level is $3\times10^{15}$ boron/cm$^3$, and a preferred thickness is 15 microns. A thermally oxidized silicon dioxide layer 230 of thickness in the range of 40-110 Å is formed on the wafer and removed from the side opposite the device layer by conventional masking and etching processes.

Figure 3:
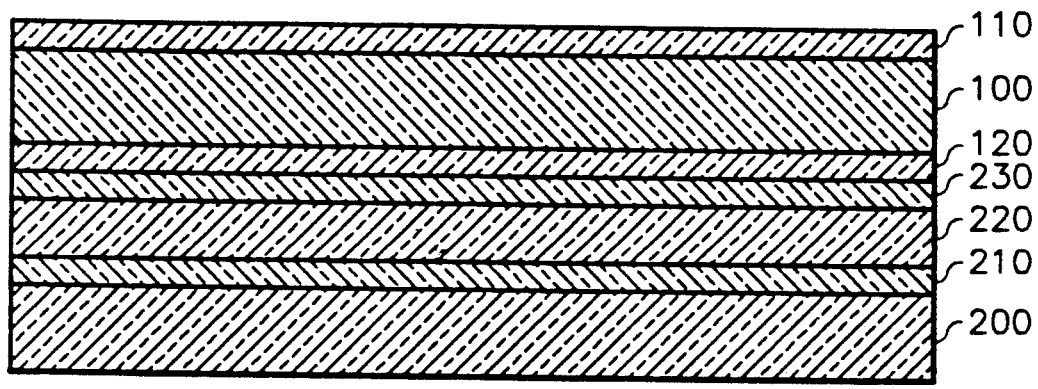
FIG. 3 shows the configuration of the composite wafer formed from the wafers in FIG. 1 and FIG. 2 after an oxide bonding process.

Referring to FIG. 3, the quartz wafer shown in FIG. 1 and the silicon wafer shown in FIG. 2 are joined by a conventional wafer bonding method. See, for example, Maszara et al., J. Applied Physics 64(10) 4943 (1988). The Maszara et al. technique involves bonding of oxides which have been hydrated by exposure to ammonium hydroxide solutions and/or water rinses. The wafers to be bonded are subjected to a cleaning process in a clean room environment to remove surface particulates. The cleaning process may involve mechanical removal using commercial scrubbers followed by an exposure to 1:1:5 mixture of hydrogen peroxide (30%), ammonium hydroxide (30%), and deionized water at 80° C. for 20 minutes. Following a deionized water rinse and a drying operation the wafers are aligned so that surface 120 of the quartz wafer contacts surface 230 of the silicon wafer. The peripheral regions of the wafers and the flatted regions are also aligned so that after bonding, the composite will appear as a single double thick wafer with a major flat. The bonding is initiated by the application of pressure from a point source at one edge of the aligned wafers. Following the initial bonding process, the composite wafer is subjected to a thermal process to strengthen the bond. The thermal process is non-critical, with parameters ranging from 10 minutes at 300° C. to 30 seconds at 1000° C. or higher. During heating, the hydrogen bonds formed from the interaction of surface hydroxyl groups react to eliminate water and begin to form Si-O-Si bonded structures.

Figure 4:
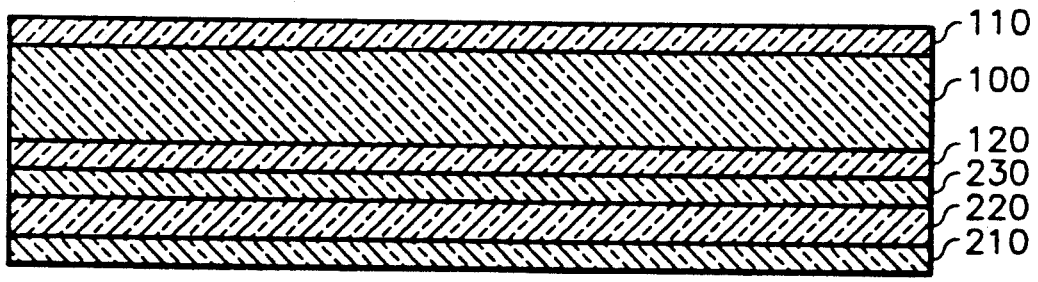
FIG. 4 shows the composite wafer of FIG. 3 after selective etching using KOH or EDP.
Figure 5:
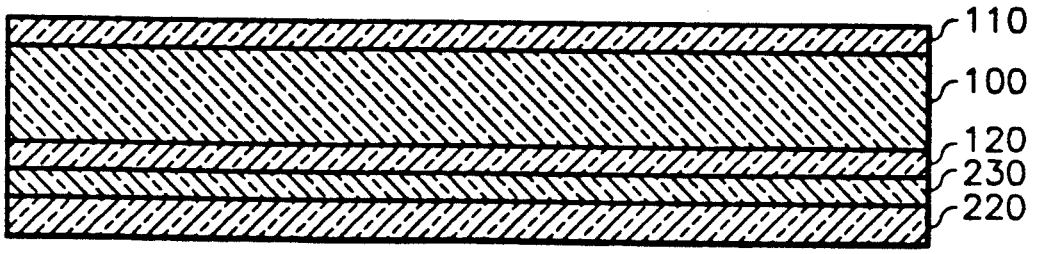
FIG. 5 shows the composite wafer of FIG. 4 after additional etching to remove the p+ layer.

Following bonding, the composite wafer is etched in a solution designed to slow its etch rate dramatically upon reaching the etch stop layer 210 shown in FIG. 4. For the boron and germanium doped etch stop, an aqueous alkaline etch such as 10% KOH or ethylenediamine pyrocatechol (EDP) is preferred. The silicon nitride layer 110 protects the quartz layer from attack by the KOH etchant at this stage. The surface of layer 210 is composed of highly boron and germanium doped silicon. This layer is removed as shown in FIG. 5, by a second etchant designed to etch highly boron doped silicon rapidly, but to etch silicon, boron doped at less than $10^{18}/cm^3$, slowly. Such an etch is composed of 1 part by volume hydrofluoric acid (49%), 3 parts by volume nitric acid . (70%) and 8 parts by volume acetic acid (100%) (1:1:8). Depending on the boron concentration of the highly doped layer, the selectivity of this etch is reported to be in the range of 25:1 to 100:1.

This etch is performed at room temperature in an ultrasonically agitated solution. In order to maintain optimum selectivity $H_2O_2$ is added dropwise to the etch bath as a yellowing is observed. The $H_2O_2$ oxidizes the $HNO_2$ formed as an etch byproduct, creating a yellow coloration. $HNO_2$, if present, would attack the p− layer, reducing the selectivity. The etch stop is observed as the formation of a bright, smooth, silvery layer in contrast to the p+ layer being etched. There are, however, dark stained regions that are formed as well. These stained regions are removed by a brief exposure to a destaining solution composed of one gram potassium permanganate dissolved in a mixture of 150 cm$^3$ of 49% HF and 150 cm$^3$ of glacial (100%) acetic acid. The 1:1:8 etch and the destaining etch have removed the highly boron and germanium doped silicon etch stop layer, typically 6 microns thick, stopping at surface 220 which is doped with boron in the range of $10^{17}$–$10^{18}$/cm$^3$.

The boron concentration is reduced from surface 220 to the device epitaxial (EPI) layer value of approximately $3 \times 10^{15}$ boron/cm$^3$ within a several hundred nanometer thickness. This layer is removed with an etch process which removes silicon at a constant rate independent of the boron concentration variation in the range below $10^{18}$/cm$^3$. An etchant such as 10% KOH at 40° C. which dissolves silicon at 100 nanometers per minute can be used on a timed basis to etch the silicon to its bulk EPI value of $3 \times 10^{15}$ boron/cm$^3$.

Figure 6:
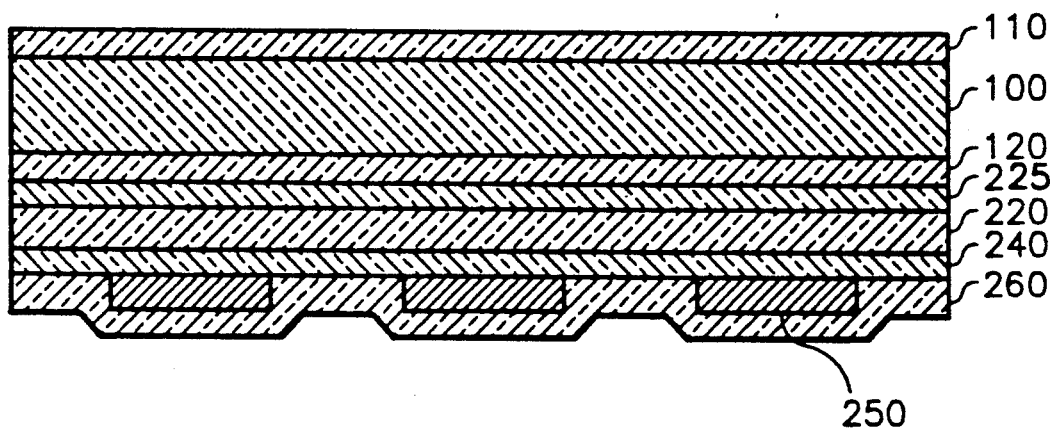
FIG. 6 shows the composite wafer of FIG. 5 after CCD fabrication; the schematic view of the bond pad region is shown.

Following the thinning process, an image sensor is fabricated on the device EPI layer 220, by standard procedures. FIG. 6 schematically represents the layer structures following the image sensor fabrication. During the thermal processing steps of fabrication, boron diffuses from the borosilicate glass layer 120 through the thin thermal oxide layer 230 (shown on FIG. 5), into the epitaxial silicon device layer 220. A thin p+ silicon layer 225 is thereby formed between layer 120 and 220. Layer 230 (shown on FIG. 5) has become part of the borosilicate glass layer 120 due to the effects of the boron diffusion. Referring to FIG. 6, the device superstructure is schematically shown in the bond pad regions of the image sensor. Layer 240 is a field oxide layer, regions 250 are aluminum bond pads and layer 260 represents a passivation coating of deposited silicon dioxide which acts as a scratch coat and etch mask. Next, layer 110 is removed with a hot phosphoric acid etch with layer 260 protecting the device on the opposite side of the wafer, as shown on FIG. 7. Also shown is the opening of bond pad contacts in layer 260, which is accomplished by standard procedures. The wafer is now ready for dicing and packaging operations.

Modeling studies have been made to relate the image sensor quantum efficiency to the system variables. A numerical model (see J. L. Gray, Phd. Thesis, Purdue University, West Lafayette, Ind., Aug. 1982) has been used which solves Poisson's equation and the carrier continuity equations in two dimensions. The model takes into account photogeneration, carrier drift and diffusion, bulk and surface recombination, fixed oxide charge and permits the entry of impurity profiles produced by the SUPREM-III process model. The latter model, see C. P. Ho et al., Technical Report No. SEL 84-001, Stanford Electronics Laboratory, Stanford University, Stanford, Calif., Jul. 1984, simulates the boron diffusion from the borosilicate glass source into the silicon. Because of the self consistent treatment of the electric field, fixed oxide charge, $Q_f$, and the surface recombination velocity, $S_n$, the device model used in the calculations offers significant advantages in design over the approximate models for the calculation of the quantum efficiency employed by other workers, cited previously. The internal quantum efficiency, QE, defined as the fractional collection of radiation incident on the layers 225 and 220 of FIG. 6, is calculated by the model and shown in FIGS. 12, 14–19. External sensor loss mechanisms such as interfacial reflectivity and absorption effects due to the BSG and quartz are not included in the model. The system variables investigated were B$_2$O$_3$ content of the BSG layer, thickness of the thermal oxide layer (230 in FIG. 2) separating the BSG layer from the silicon device layer ($T_{ox}$), the silicon surface recombination velocity ($S_n$) and the fixed oxide charge in the thermal oxide layer ($Q_f$). $Q_f$ is also referred to as $Q_{ss}$ in earlier literature.

Figure 8:
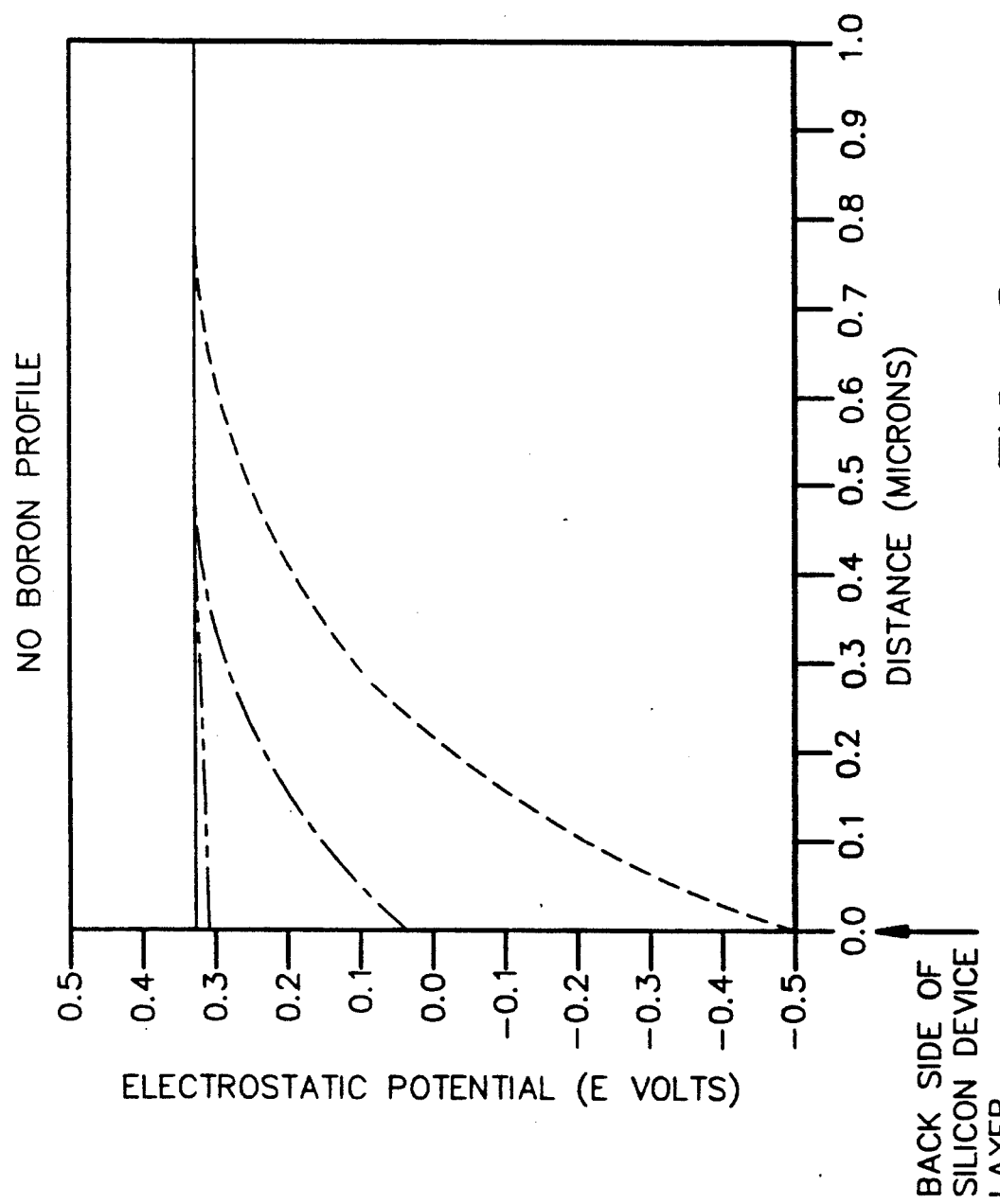
FIGS. 8-9 models the electrostatic potential of the silicon device layer versus distance for various fixed oxide charge levels without boron doping of the backside.
Figure 9:
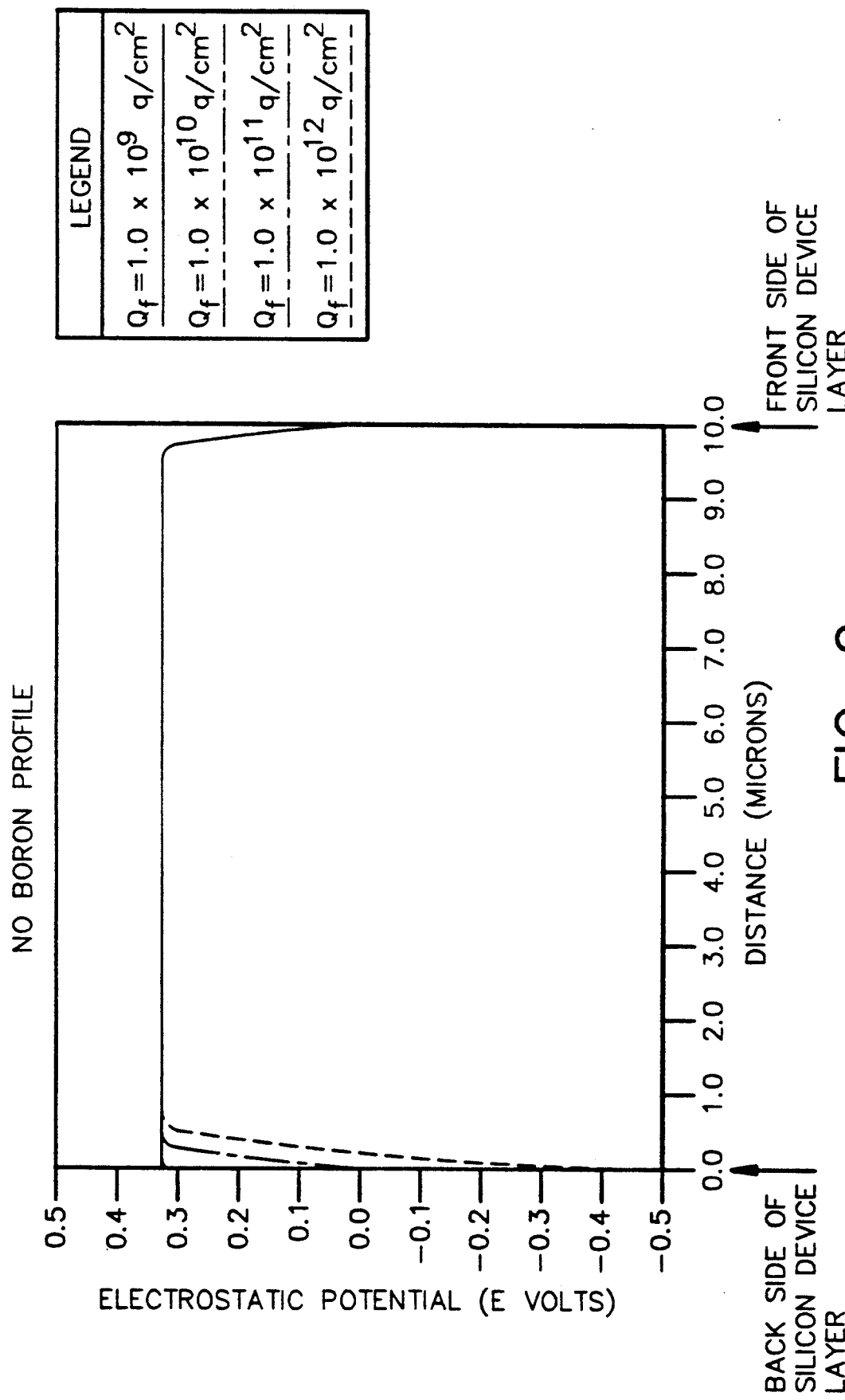
Figure 10:
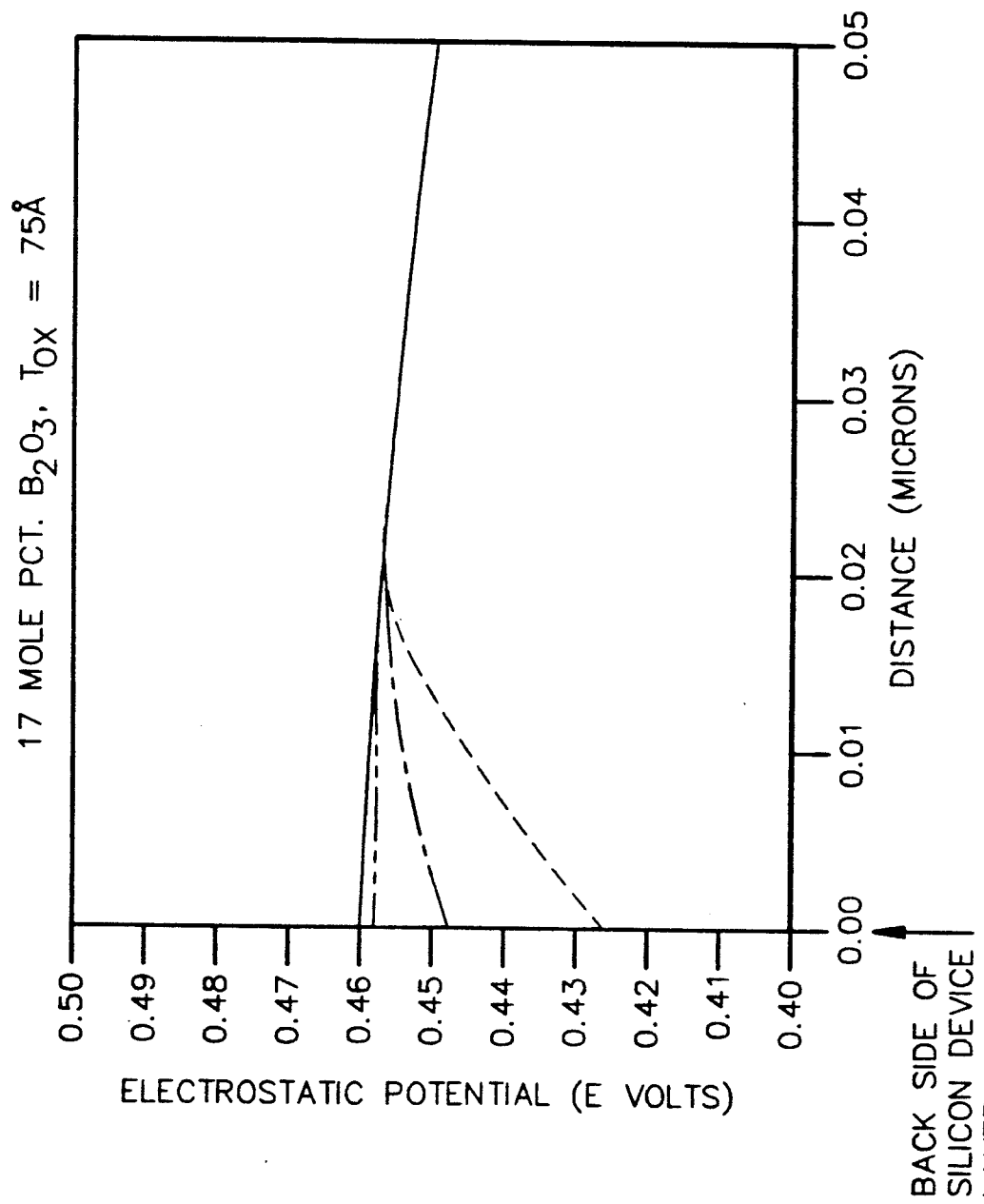
FIGS. 10-11 models the electrostatic potential of the silicon device layer versus distance for various fixed oxide charge levels with boron doping of the backside.
Figure 11:
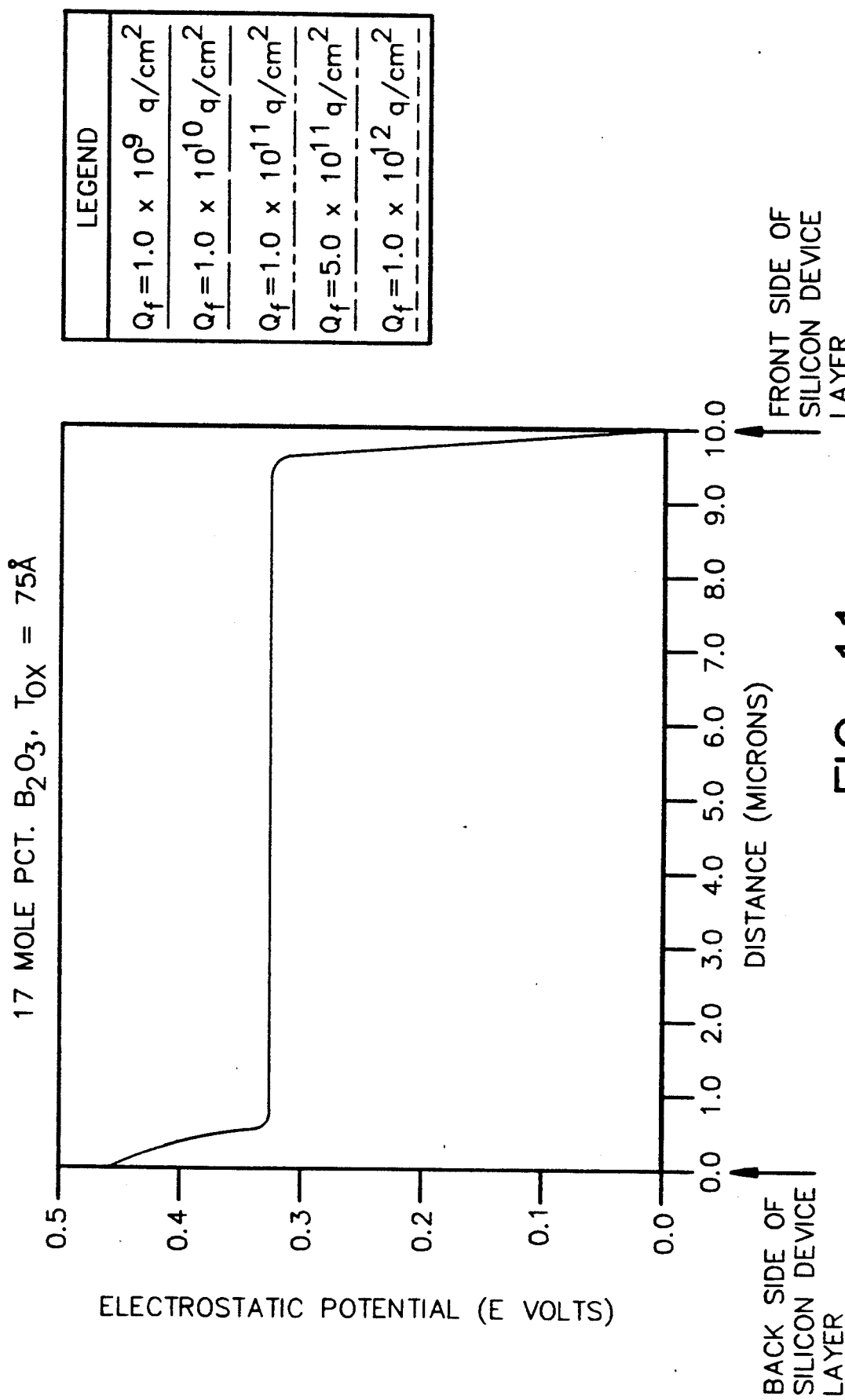

The effect of $Q_f$ on the electrostatic field at the back of the silicon device layer is shown in FIGS. 8–11. Referring to FIGS. 8 and 9, the backside potential is shown for varying $Q_f$ levels with no boron doping. It is seen that large potential wells at the back surface are formed with $Q_f = 1 \times 10^{11}$ q/cm$^2$ and $1 \times 10^{12}$ q/cm$^2$, where q is the value of the electron charge. If an electron is photogenerated within these potential wells, extending 0.4–0.6 microns into the silicon device layer, it will be retained at the backside of the device and not collected at the frontside potential well as required. Referring to FIGS. 10 and 11, the backside potential is shown for a specific boron doping condition, namely 17 mole percent B$_2$O$_3$ in a 500Å BSG layer with a 75Å thick thermal oxide layer between the BSG and the silicon device layer. It is seen that potential wells very close to the back surface (0.02 microns) are formed for $Q_f = 5 \times 10^{11}$ q/cm$^2$ and $1 \times 10^{12}$ q/cm$^2$, but not for $Q_f = 1 \times 10^{11}$ q/cm$^2$ or lower. Therefore, the effects of $Q_f$ levels of $1 \times 10^{11}$ q/cm$^2$ or less are eliminated by introducing a suitable concentration of boron in the backside of the silicon device layer. Thus, photogenerated electrons, particularly those in the ultraviolet range, will be forced by the potential field to the frontside potential wells where they will be collected. Deal et al., J. Electrochemical Society, Vol. 114, 267(1967) reports $Q_{ss}$ ($Q_f$) levels of $2 \times 10^{10}$ q/cm$^2$ in oxides grown on <100> oriented silicon such as used for imaging devices.

Figure 12:
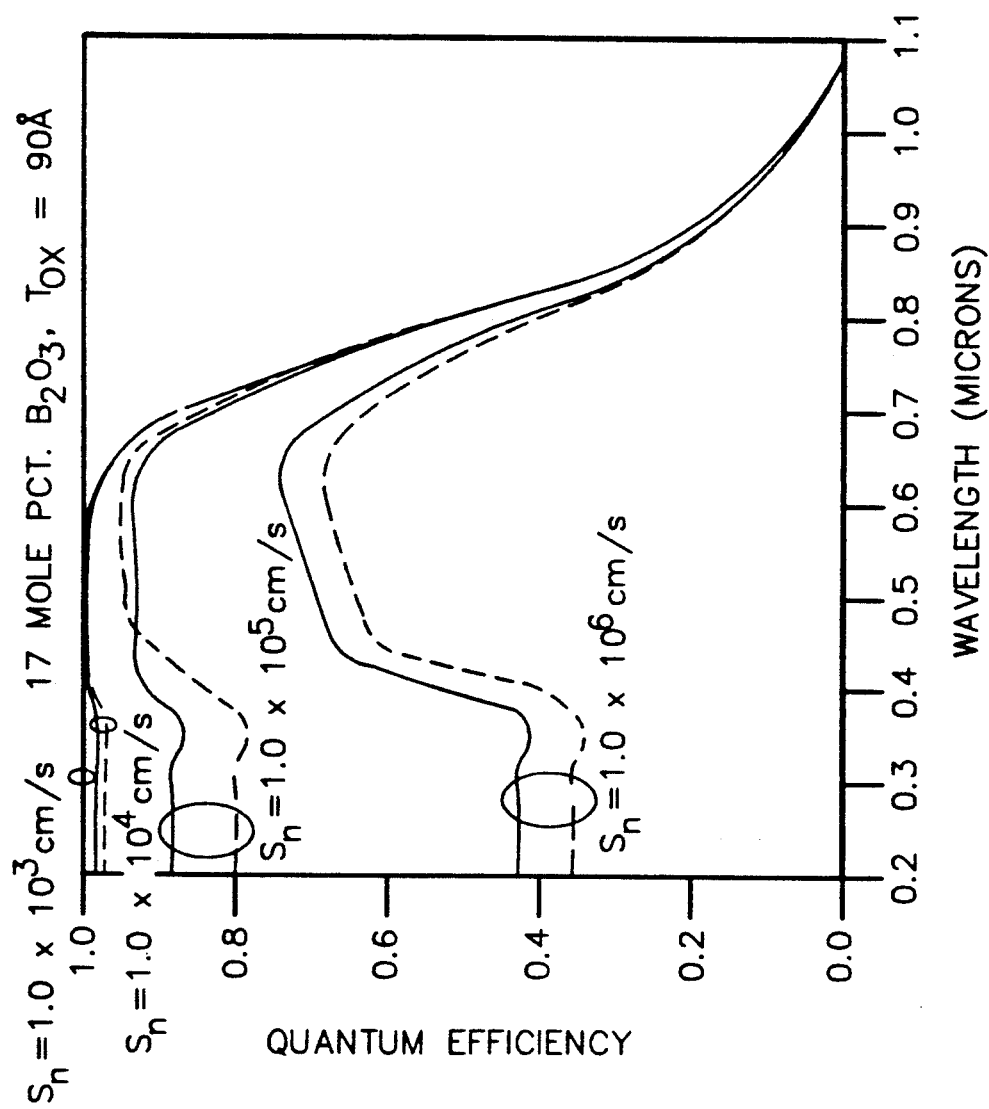
FIG. 12 models sensor quantum efficiency versus incident radiation wavelength for various fixed oxide charge levels.
Figure 13:
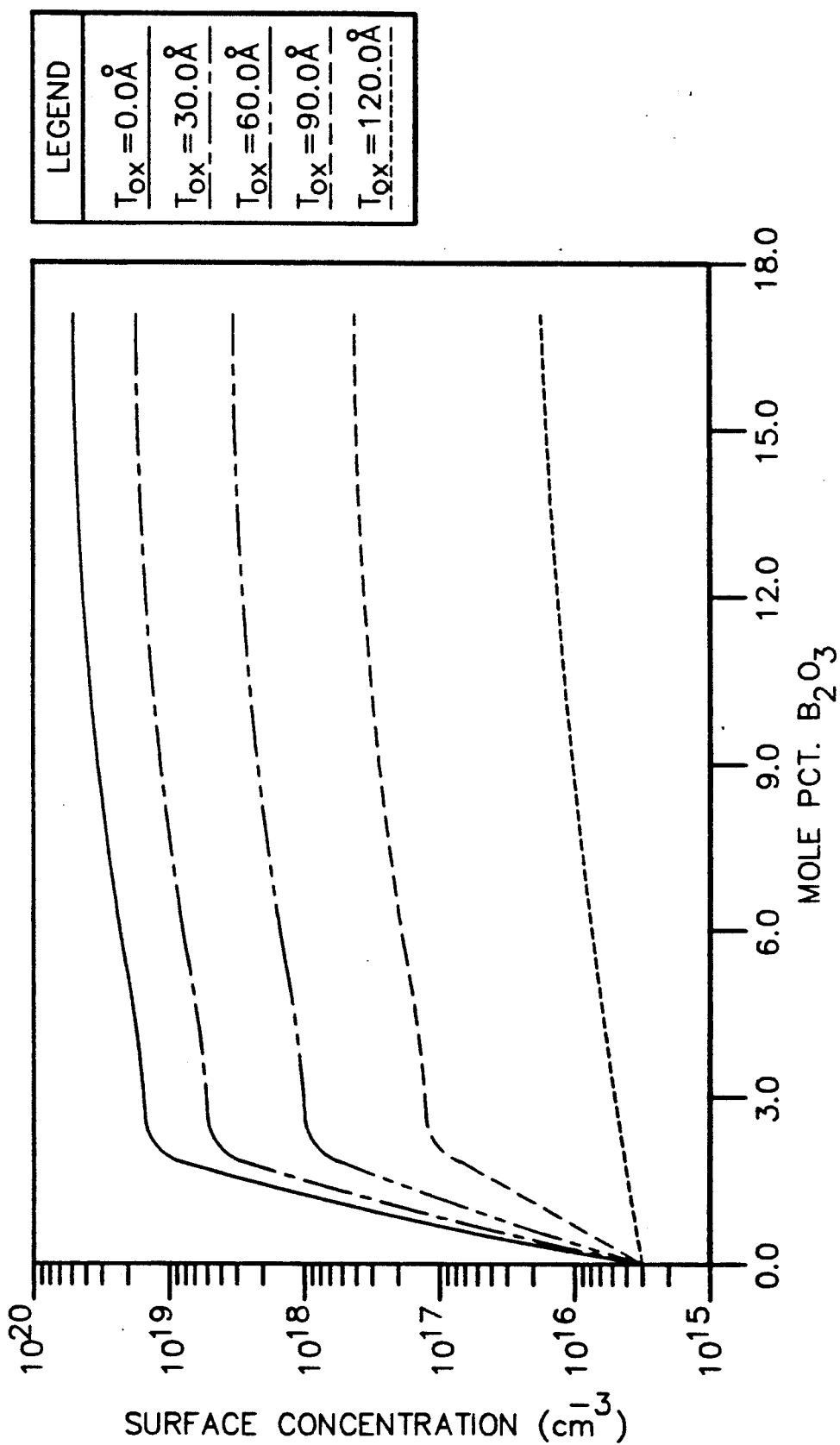
FIG. 13 models boron surface concentration of the backside of the silicon device layer versus $B_2O_3$ concentration in the borosilicate glass layer for various thermal oxide layer thicknesses.
Figure 14:
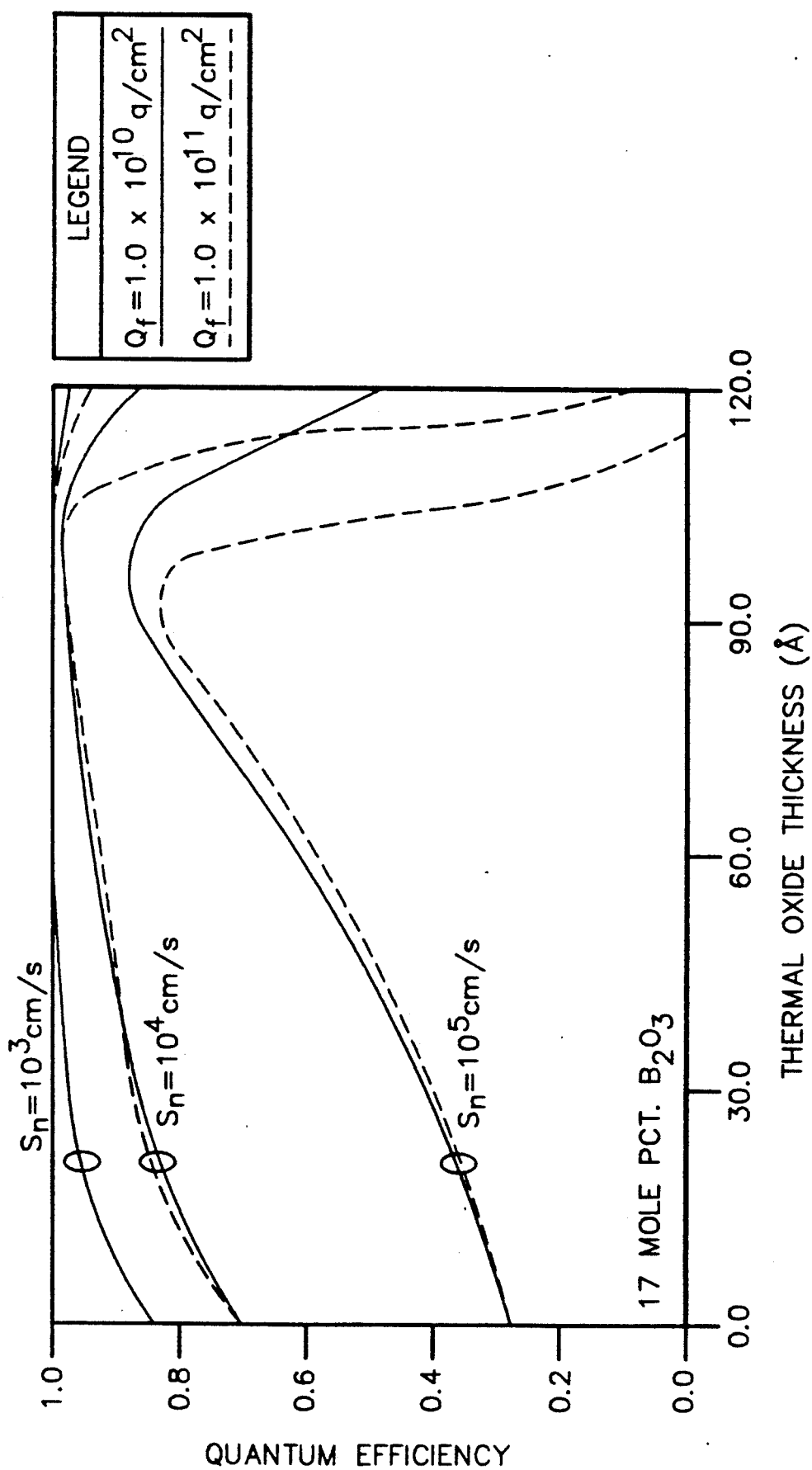
FIG. 14 models quantum efficiency versus thermal oxide layer thickness for various values of surface recombination velocity and fixed oxide charge.
Figure 15:
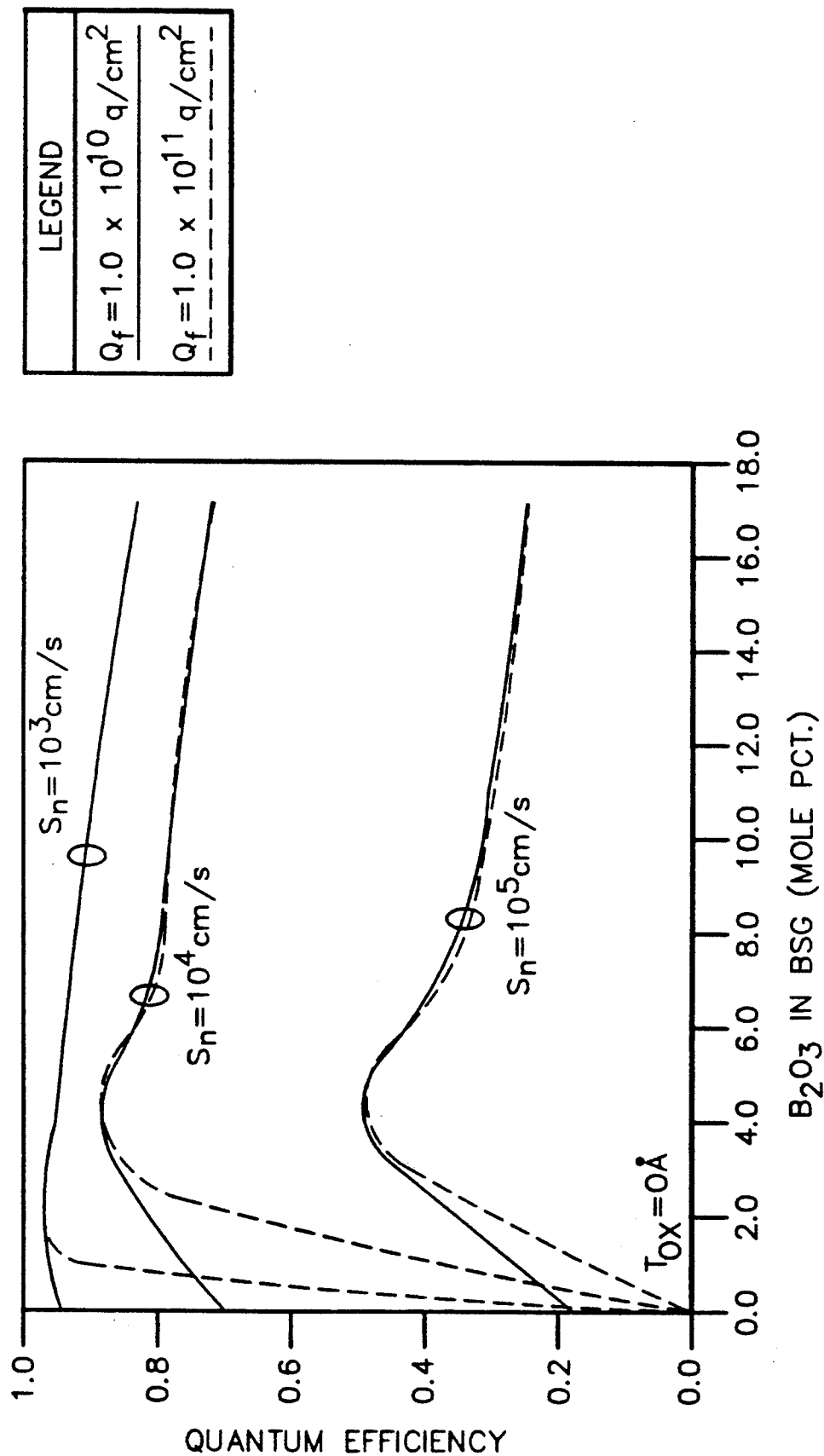
FIGS. 15-19 depict models of quantum efficiency versus $B_2O_3$ concentration in borosilicate glass for various levels of surface recombination velocity and fixed oxide charge for thermal oxide thicknesses varying from 0 to 120 Å.
Figure 16:
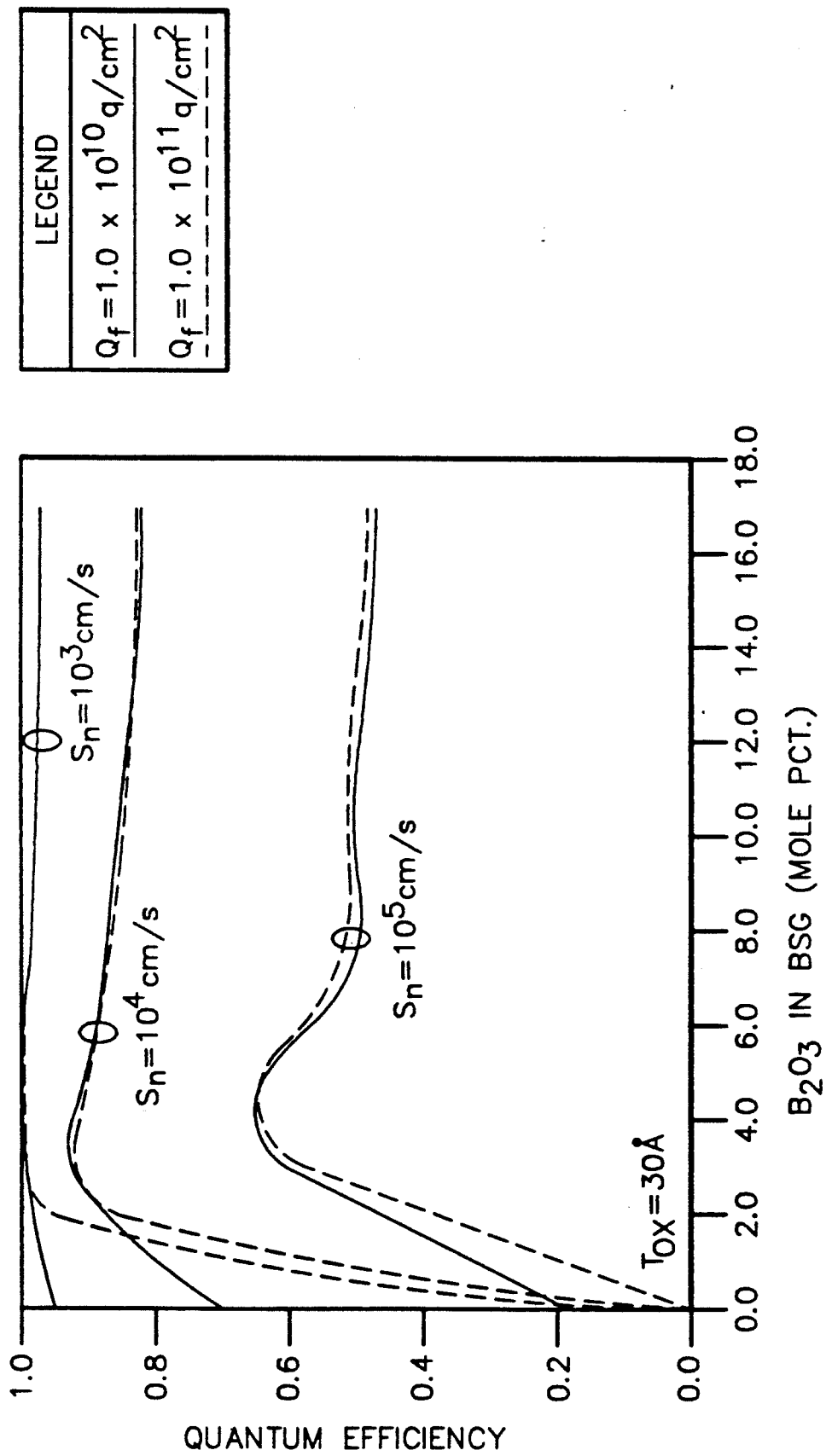
Figure 17:
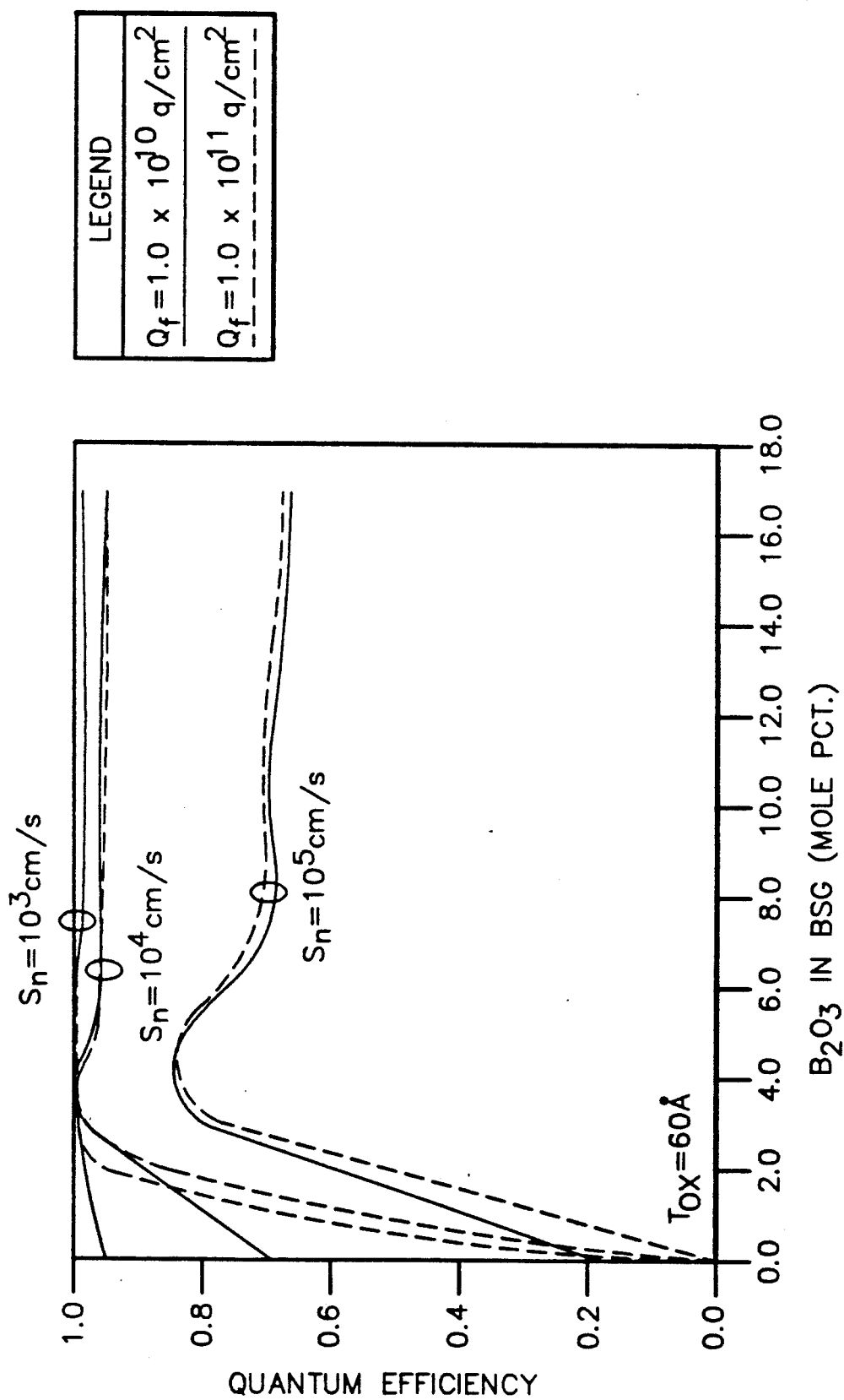
Figure 18:
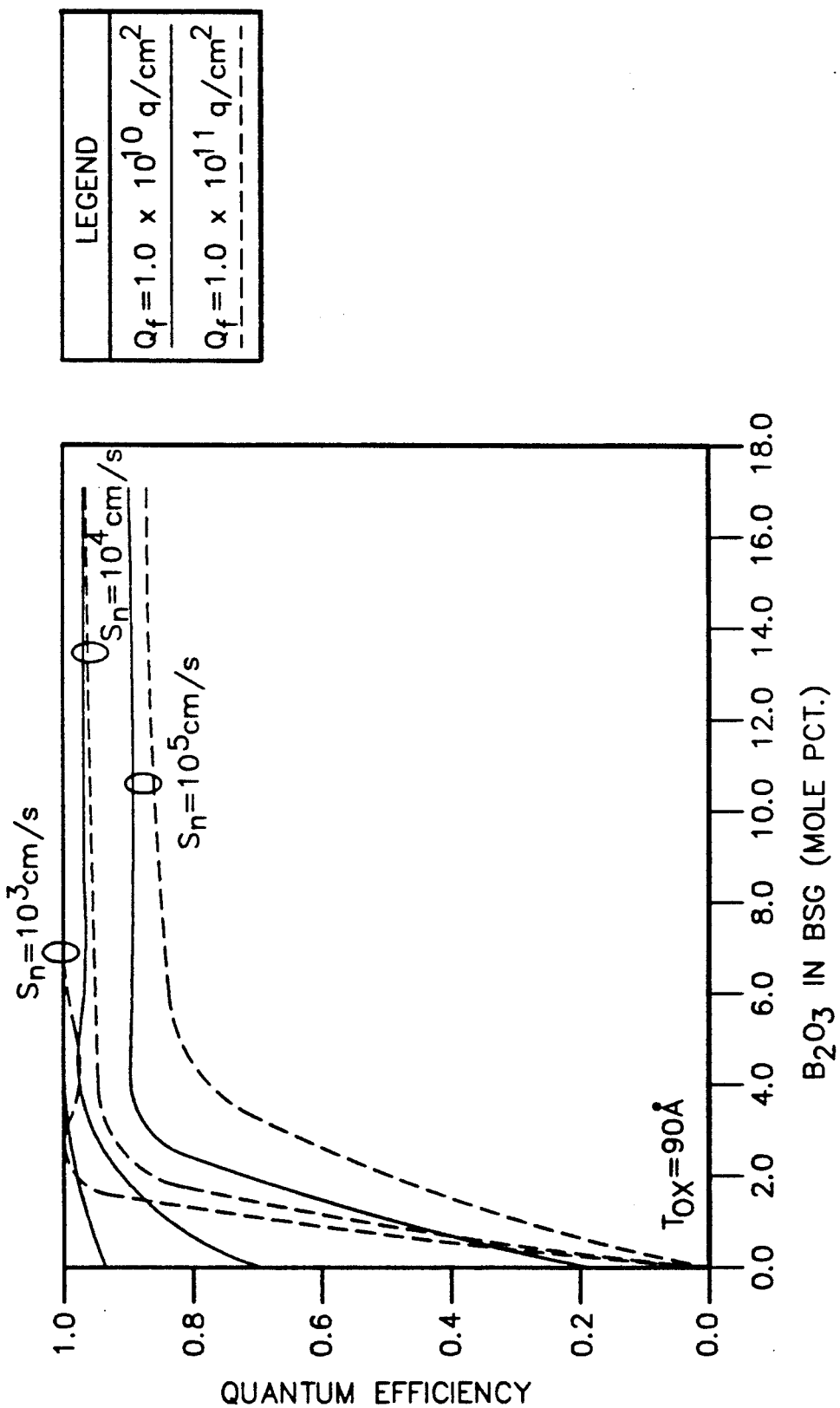
Figure 19:
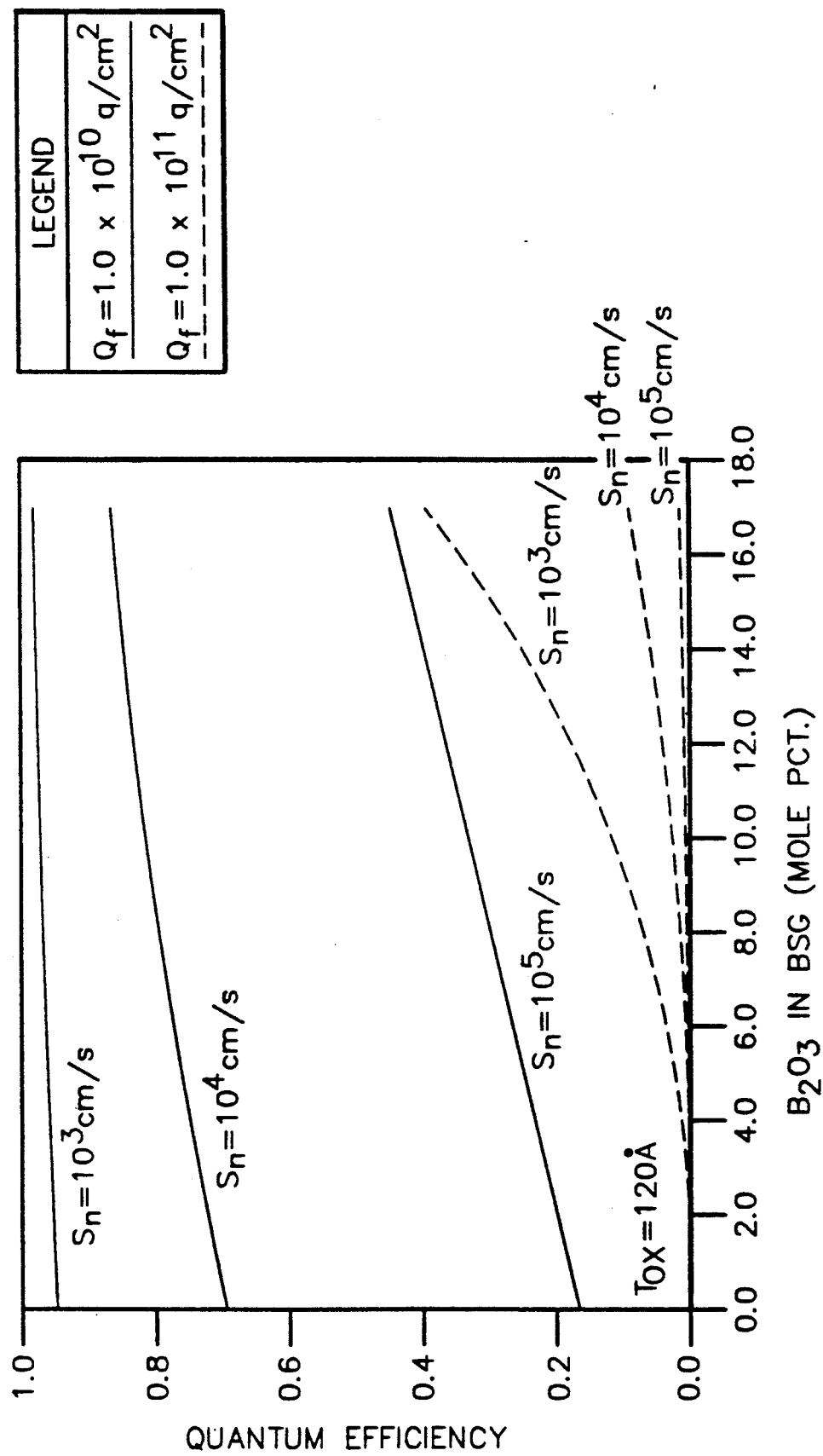

Referring to FIG. 12, sensor quantum efficiency (QE) is shown as a function of incident radiation wavelength for varying levels of $S_n$ and $Q_f$. The backside doping conditions are again fixed by specifying a B$_2$O$_3$ concentration of 17 mole percent and a thermal oxide thickness of 90Å. The thermal process to effect boron diffusion was taken as the thermal load involved in the fabrication of an image sensor. It is seen that the QE for any given value of $S_n$ and $Q_f$ is relatively uniform in the wavelength range 0.20–0.36 microns. The value of QE in subsequent figures is defined to be the value in this wavelength region. It is to be noted that QE for values of $S_n$ in the range $1 \times 10^3$–$1 \times 10^4$ cm/sec are $\geq 98\%$ over the wavelength range 0.2–0.6 microns for values of $Q_f$ up to $1 \times 10^{11}$ q/cm$^2$. R. R. King et al., IEEE Trans. on Electron Devices, Vol. 38, 1399 (1991) has reported $S_n$ values of $1.6 \times 10^3$ cm/s for silicon devices doped with boron diffusions in the concentration range $1 \times 10^{17}$–$1 \times 10^{19}$/cm$^3$. The boron concentrations associated with the backside of the image sensors for varying values of B$_2$O$_3$ concentration in BSG and for varying thermal oxide thickness are shown in FIG. 13 to be in the same concentration range described by King. According to standard references (for example, A. S. Grove, Physics and Technology of Semiconductor Devices, John Wiley, New York, 1967, pp. 144–145) the theoretical value for the surface recombination velocity on thermally oxidized silicon surfaces can be as low as 1 to 10 cm-sec$^{-1}$, orders of magnitude below the values encountered thus far in this discussion. In contrast, a value of $S_n$ of $1 \times 10^6$ cm/s has been estimated for sensors modeled by Huang, Proceedings of 1991 IEEE CCD Workshop, University of Waterloo (1991). The data modeled by Huang was obtained from sensors with backsides accumulated using ion implantation and laser annealings. These processes create extensive silicon damage which is manifested by high $S_n$ values. By comparison, thermally diffused doping results in less silicon damage and is characterized by low $S_n$ values allowing the use of a substantially broader range of doping levels than encountered in ion implantation, as illustrated in FIGS. 14-19. Referring to FIG. 14, QE is shown as a function of thermal oxide thickness for various values of $S_n$ and $Q_f$. The $B_2O_3$ concentration is fixed at 17 mole percent in the BSG layer. It is seen that for $S_n = 1 \times 10^3$ cm/s a range of thermal oxide thicknesses of 50-100Å gives near 100% QE. For $S_n = 1 \times 10^4$ cm/s a QE maximum is obtained at 99% with a thermal oxide of 100Å. At a higher $S_n$ value of $1 \times 10^5$ cm/s QE is limited to 88% with a thermal oxide thickness of 90Å. Sensor QE is shown as a function of $B_2O_3$ in BSG for various $S_n$ and $Q_f$ in FIGS. 15-19. The thermal oxide thickness is fixed at 0, 30, 60, 90, and 120Å, respectively, in FIGS. 15, 16, 17, 18, and 19. For the practical ranges of $S_n$ and $Q_f$ chosen in this study, the highest values of QE and the broadest useful ranges of $B_2O_3$ concentration in BSG are found when using a thermal oxide thickness of 90Å as shown in FIG. 18. Referring to FIG. 18, it is seen that 100% QE is obtained with $B_2O_3$ in the range of 2-17% with $S_n$ fixed at $1 \times 10^3$ cm/s. As $S_n$ is increased to $1 \times 10^4$ cm/s the optimum $B_2O_3$ range is reduced to approximately 4-17%. With $S_n$ increased to $1 \times 10^5$ cm/s the optimum $B_2O_3$ concentration range shrinks to 8-17 mole percent for $Q_f = 1 \times 10^{10}/cm^2$ and the QE maximum is reduced to 88%. It can be seen in FIG. 15 that the absence of a thermal oxide layer results in lower relative QE values. This effect is related to high boron surface concentrations as can be seen in FIG. 13 which result in recombination of photogenerated electrons and holes. Conversely, it can be seen that when the thermal oxide thickness is increased to 120Å very little boron is diffused into the silicon surface regardless of $B_2O_3$ concentration. This results in poor QE response and high sensitivity to $Q_f$ levels, as shown in FIG. 19.

Figure 20:
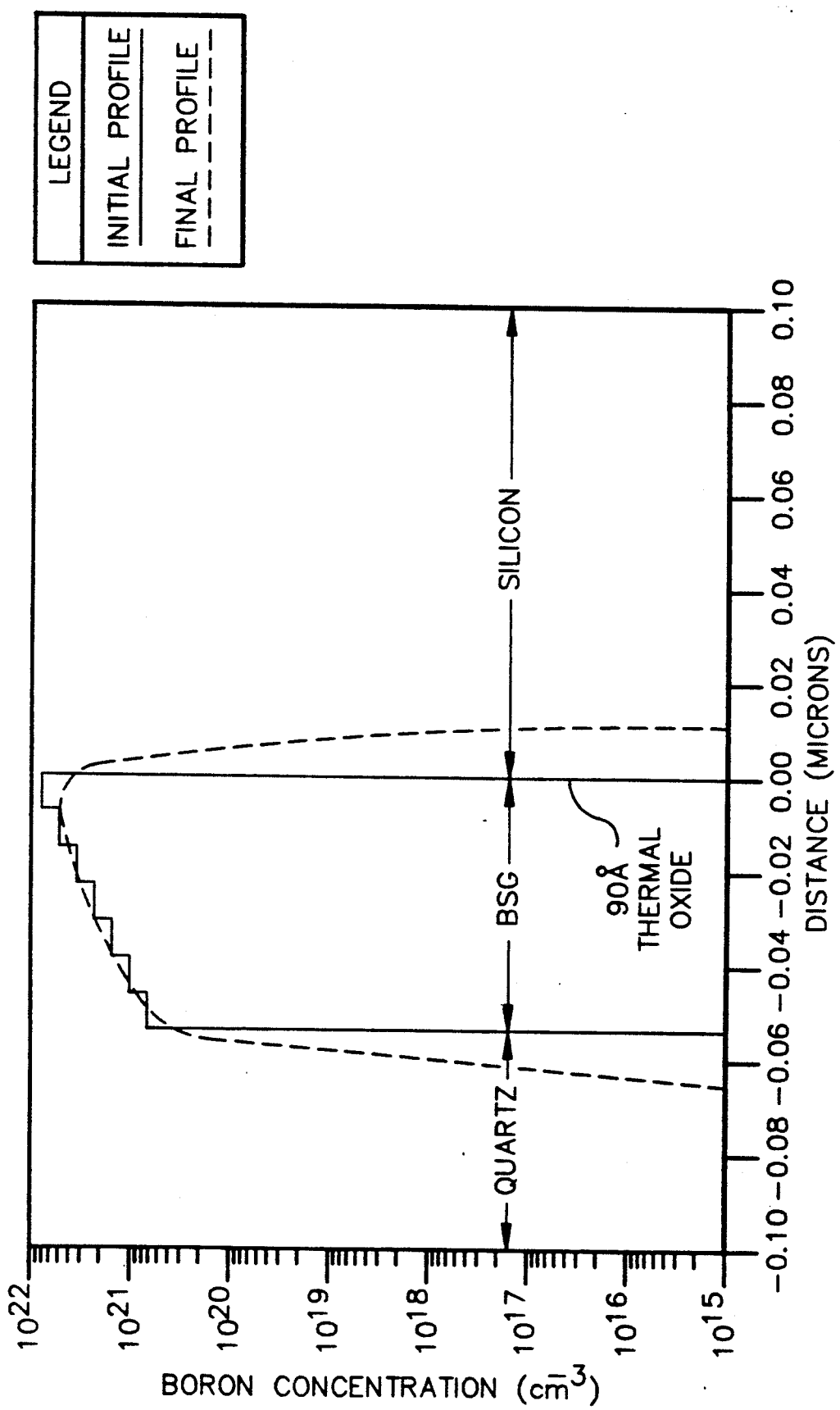
FIG. 20 models the boron profile in a sensor with a linearly varying $B_2O_3$ concentration in the borosilicate glass layer. The boron profile is shown before and after thermal processing.

Referring to FIG. 20, the pre- and post-diffusion boron distribution is modeled for a BSG layer of 500Å thickness and a $B_2O_3$ concentration which linearly increases in 10 steps from 0 to 17 mole percent. All of the boron diffusing into the silicon is sourced from a 50Å region of the BSG layer closest to the silicon. Therefore, such a linearly varying BSG layer will not be greatly affected by the diffusion process, but can be used to advantage to reduce stress due to thermal expansion as well as to remove optical absorption effects due to boron in the BSG layer.

In summary, modeling studies show that $S_n$ values in the range $1 \times 10^3 - 1 \times 10^4$ cm/s allow the fabrication of thinned image sensors with nearly 100% internal quantum efficiency using BSG sourced backside doping. A thin thermal oxide, optimally 90Å in thickness, interposed between the BSG and silicon device layer, improves sensor QE and the acceptable range of $B_2O_3$ concentration in the BSG. A linearly varying $B_2O_3$ concentration in the BSG does not affect the diffusion characteristics of the source.

The thermal expansion coefficient of quartz is measured at $5 \times 10^{-7}$ cm/cm-° C. while that of silicon is measured at $26 \times 10^{-7}$ cm/cm-° C. The mismatch of the thermal expansion coefficient results in a stress which increases with temperature and contact area. Excessive stress can result in delamination of bonded layers or damage to the silicon or quartz in the form of dislocations or cracks. Goetz and Fathimula reported bonding of quartz to silicon, but they had to delineate the silicon into islands in order to control thermally induced stresses to manageable levels. This method thereby limits the size of imaging devices to the size of the islands of silicon. Use of a borosilicate glass layer interposed between the quartz and silicon layer reduces thermally induced stress to manageable levels by providing a material with an expansion coefficient intermediate between that of quartz and silicon. Kern and Heim reported that the thermal expansion and contraction match of borosilicate glass and silicon improve with increasing boron content up to 30 mole percent. In their experiments, a 17 mole percent $B_2O_3$ BSG layer of 12 micron thickness was deposited crack-free on a silicon substrate. The lateral expansion mismatch in layers disclosed in this patent application are quite similar except the thin layer is silicon and the thicker layer is quartz. In addition, the graded application of BSG through the linearly increasing boron content as shown in FIG. 20 minimizes the stress by distributing the thermal expansion difference across the BSG layer. The ability of BSG to flow at elevated temperatures used in the fabrication of image sensors provides an additional mechanism for relief of stresses associated with the mismatch of thermal expansion coefficients of the device layers. Kern and Heim report the softening temperature of 17 mole percent $B_2O_3$ BSG is in the range of 800°-850° C. Therefore, the higher stress levels associated with the processes in excess of 800°-850° C. will be eliminated, if similarly high levels of boron is present in the BSG used.

Figure 7:
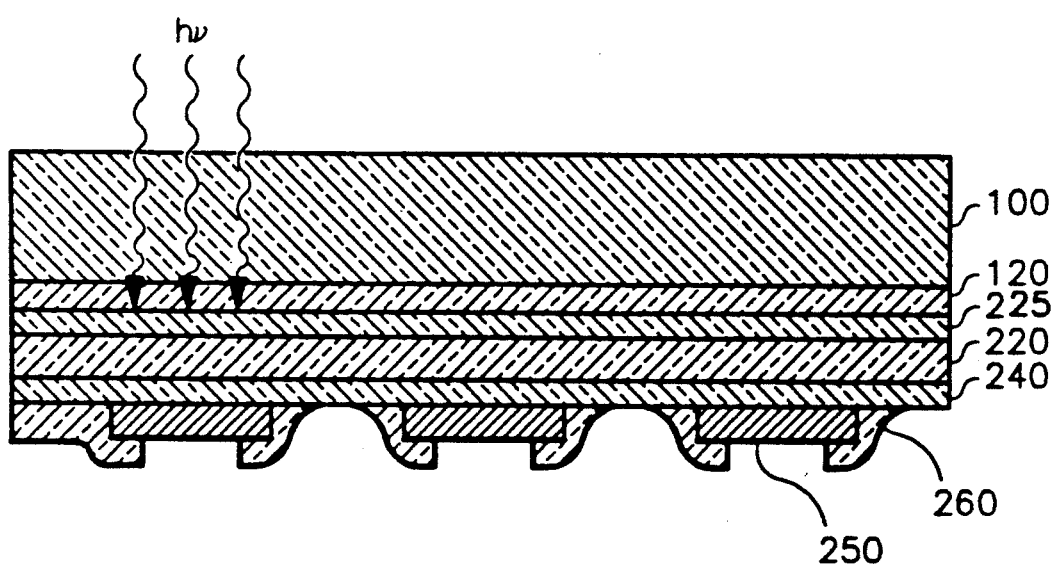
FIG. 7 shows the composite wafer of FIG. 6 after opening of bond pad contacts and removal of the silicon nitride layer.

Referring to FIG. 7, it is seen that incident radiation must pass through quartz wafer 100 and BSG layer 120 in order to be absorbed in silicon layer 225. Any absorption associated with these layers will reduce the sensor quantum efficiency.

The external transmittance of fused quartz is in excess of 90% for most of the ultraviolet range down to 0.2 microns. See Handbook of Optics, Optical Society of America, McGraw Hill 6-94 (1978). The effect of boron absorption from 12 mole percent $B_2O_3$ in BSG has been estimated at 1% for a 500Å thick layer. The calculation was made by substracting the transmission data taken from $SiO_3$ glasses doped with boron and phosphorous (BPSG) and phosphorous (PSG), using equivalent phosphorous doping. An assumption was made that the spectral difference is associated with absorptive effects of boron in the $SiO_2$ matrix. Therefore, absorptive effects of the quartz support and BSG layers as discussed will reduce the overall QE by at most 10%.

The invention has been described in detail with particular reference to certain preferred embodiments thereof, but it will be understood that variations and modifications can be effected within the spirit and scope of the invention.

We claim:

1. A process for making backside illuminated image sensors comprising the steps of:
   (a) forming a doped etch stop layer on a silicon wafer;
   (b) forming a device layer on the etch stop layer;
   (c) forming an oxide layer having a controlled thickness on the device layer;
   (d) forming a borosilicate glass layer on one side of a quartz support wafer;
   (e) forming a silicon nitride layer on the other side of the quartz support wafer;
   (f) bonding the borosilicate glass surface of the support wafer to the oxide layer on the device layer of the silicon wafer, forming a composite wafer;

(g) etching the bonded composite wafer up to the device layer;

(h) forming devices including bond pads in the device layer;

(i) etching the silicon nitride layer from the quartz support wafer to eliminate optical absorption of ultraviolet radiation by the silicon nitride layer; and (j) etching the devices to uncover the bond pads.

2. The method of claim 1 wherein the oxide layer on the device layer has a range of thickness from 40 to 110Å.

3. The method of claim 2 wherein the oxide layer on the device layer has a range of thickness from 80–100Å.

4. The method of claim 1 wherein the $B_2O_3$ concentration in the borosilicate glass is in the range of 2 to 17 mole percent.

5. The method of claim 4, wherein useful ranges of $B_2O_3$ concentration and thermal oxide thickness are dependent on $S_n$ values and are expanded as $S_n$ is reduced.

6. The method of claim 1 wherein the borosilicate glass layer has a gradation of boron concentration with a minimum value in contact with the quartz support wafer and a maximum value at its top surface.

7. The method of claim 1 wherein the etch stop layer is silicon co-doped with $1 \times 10^{20}$ boron atoms/cm$^3$ and $1 \times 10^{21}$ germanium atoms/cm$^3$.

* * * * *